(12) United States Patent
Park et al.

(10) Patent No.: US 11,967,581 B2
(45) Date of Patent: Apr. 23, 2024

(54) PACKAGE STRUCTURES HAVING UNDERFILLS

(71) Applicant: SAMSUNG ELECTRONICS CO., LTD., Suwon-si (KR)

(72) Inventors: Jinwoo Park, Suwon-si (KR); Unbyoung Kang, Suwon-si (KR); Jongho Lee, Suwon-si (KR); Teakhoon Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/110,446

(22) Filed: Feb. 16, 2023

(65) Prior Publication Data

US 2023/0197681 A1 Jun. 22, 2023

Related U.S. Application Data

(63) Continuation of application No. 17/168,238, filed on Feb. 5, 2021, now Pat. No. 11,587,906.

(30) Foreign Application Priority Data

Jul. 10, 2020 (KR) .................. 10-2020-0085452

(51) Int. Cl.
*H01L 23/16* (2006.01)
*H01L 23/00* (2006.01)
*H01L 23/31* (2006.01)
*H01L 23/367* (2006.01)
*H01L 25/065* (2023.01)

(52) U.S. Cl.
CPC .......... *H01L 25/0652* (2013.01); *H01L 23/16* (2013.01); *H01L 23/3128* (2013.01); *H01L 23/3135* (2013.01); *H01L 23/3675* (2013.01); *H01L 23/562* (2013.01); *H01L 2225/06513* (2013.01); *H01L 2225/06541* (2013.01); *H01L 2225/06586* (2013.01); *H01L 2225/06589* (2013.01)

(58) Field of Classification Search
CPC . H01L 23/3675; H01L 25/0652; H01L 23/16; H01L 23/3128; H01L 23/3135
See application file for complete search history.

(56) References Cited

U.S. PATENT DOCUMENTS

| | | | |
|---|---|---|---|
| 9,343,432 B2 | 5/2016 | Lee et al. | |
| 9,653,428 B1 | 5/2017 | Hiner et al. | |
| 9,698,072 B2 | 7/2017 | Brofman et al. | |
| 10,510,605 B2 | 12/2019 | Chang et al. | |
| 11,817,422 B2 * | 11/2023 | Igarashi | ................. H01L 24/32 |

(Continued)

*Primary Examiner* — Thao P Le
(74) *Attorney, Agent, or Firm* — Muir Patent Law, PLLC

(57) ABSTRACT

A package structure includes a lower substrate, substrate connection terminals on the lower substrate, a semiconductor package on the substrate connection terminals, the semiconductor package including a package substrate and a first encapsulant covering the package substrate, first underfills between the lower substrate and the semiconductor package, the first underfills covering corner portions of the semiconductor package, as viewed in a plan view, and covering at least one of the substrate connection terminals, and a second underfill between the lower substrate and the semiconductor package, the second underfill covering a side surface of the semiconductor package in a plan view.

20 Claims, 12 Drawing Sheets

(56) References Cited

U.S. PATENT DOCUMENTS

| | | |
|---|---|---|
| 2009/0045507 A1 | 2/2009 | Pendse et al. |
| 2014/0061890 A1* | 3/2014 | Lee .................... H01L 25/0652 |
| | | 257/701 |
| 2015/0137345 A1* | 5/2015 | Choi ....................... H01L 23/04 |
| | | 257/713 |
| 2018/0005987 A1 | 1/2018 | Hiner et al. |
| 2020/0006181 A1 | 1/2020 | Chen et al. |
| 2020/0075572 A1 | 3/2020 | Chang et al. |
| 2020/0091129 A1 | 3/2020 | Fujimaki |
| 2020/0411393 A1* | 12/2020 | Kim ....................... H01L 24/05 |
| 2021/0035878 A1 | 2/2021 | Jin et al. |
| 2021/0104483 A1 | 4/2021 | Park et al. |
| 2021/0111159 A1 | 4/2021 | Park et al. |
| 2021/0118803 A1 | 4/2021 | Park et al. |
| 2021/0125908 A1 | 4/2021 | Jang et al. |
| 2021/0134761 A1 | 5/2021 | Oh et al. |
| 2021/0225727 A1* | 7/2021 | Chen .................. H01L 23/3675 |
| 2022/0102257 A1 | 3/2022 | Kim et al. |
| 2022/0122896 A1* | 4/2022 | Wang .................... H01L 25/105 |
| 2022/0375812 A1* | 11/2022 | Kim ....................... H01L 23/433 |
| 2023/0005835 A1* | 1/2023 | Song ................. H01L 23/49894 |
| 2023/0055812 A1* | 2/2023 | Choi ....................... H01L 25/50 |
| 2023/0369246 A1* | 11/2023 | Yeh .................... H01L 23/5384 |

\* cited by examiner

PACKAGE STRUCTURES HAVING UNDERFILLS

CROSS-REFERENCE TO THE RELATED APPLICATION

This is a continuation of U.S. patent application Ser. No. 17/168,238 filed Feb. 5, 2021, which is incorporated by reference herein in its entirety.

Korean Patent Application No. 10-2020-0085452, filed on Jul. 10, 2020, in the Korean Intellectual Property Office, and entitled: "Package Structures Having Underfills," is incorporated by reference herein in its entirety.

BACKGROUND

1. Field

Embodiments relate to package structures having underfills.

2. Description of the Related Art

As demand for highly integrated and miniaturized semiconductor devices increases, a size of each semiconductor device is progressively minimized. In addition, semiconductor packages are required to process high-capacity data. Accordingly, a semiconductor package structure in which a plurality of semiconductor chips is molded is used.

SUMMARY

A package structure in accordance with an embodiment of the disclosure may include a lower substrate, substrate connection terminals on the lower substrate, a semiconductor package on the substrate connection terminals, the semiconductor package including a package substrate and a first encapsulant covering the package substrate, first underfills between the lower substrate and the semiconductor package, the first underfills covering at least one of the substrate connection terminals and covering a corner portion of the semiconductor package in a plan view, and a second underfill between the lower substrate and the semiconductor package, the second underfill covering a side surface of the semiconductor package in a plan view.

A package structure in accordance with an embodiment of the disclosure may include a lower substrate, substrate connection terminals on the lower substrate, a semiconductor package on the substrate connection terminals, the semiconductor package including a package substrate and a first encapsulant covering the package substrate, a stiffener on the lower substrate and extending around the semiconductor package, a heat spreader on the stiffener, the heat spreader being connected to the stiffener and an upper surface of the semiconductor package, first underfills between the lower substrate and the semiconductor package, the first underfills covering at least one of the substrate connection terminals and covering a corner portion of the semiconductor package in a plan view, and a second underfill between the lower substrate and the semiconductor package, the second underfill covering a side surface of the semiconductor package in a plan view.

A package structure in accordance with an embodiment of the disclosure may include a lower substrate including upper pads thereon, external connection terminals on a lower surface of the lower substrate, substrate connection terminals connected to the upper pads, a semiconductor package on the substrate connection terminals, the semiconductor package including a package substrate, first semiconductor chips and second semiconductor chips on the package substrate, and a first encapsulant covering the package substrate the first semiconductor chips and the second semiconductor chips, first underfills on the lower substrate and including an inner portion overlapping the semiconductor package in a vertical direction and an outer portion not overlapping the semiconductor package in the vertical direction, the inner portion covering at least one of the substrate connection terminals and the outer portion covering a corner portion of the semiconductor package in a plan view, and a second underfill between the lower substrate and the semiconductor package, the second underfill covering a side surface of the semiconductor package in a plan view. Each of the second semiconductor chips may include first to fourth memory chips stacked in the vertical direction. Four second semiconductor chips may be disposed adjacent to each of the first semiconductor chips. Lower surfaces of the inner portion and the outer portion may be coplanar.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
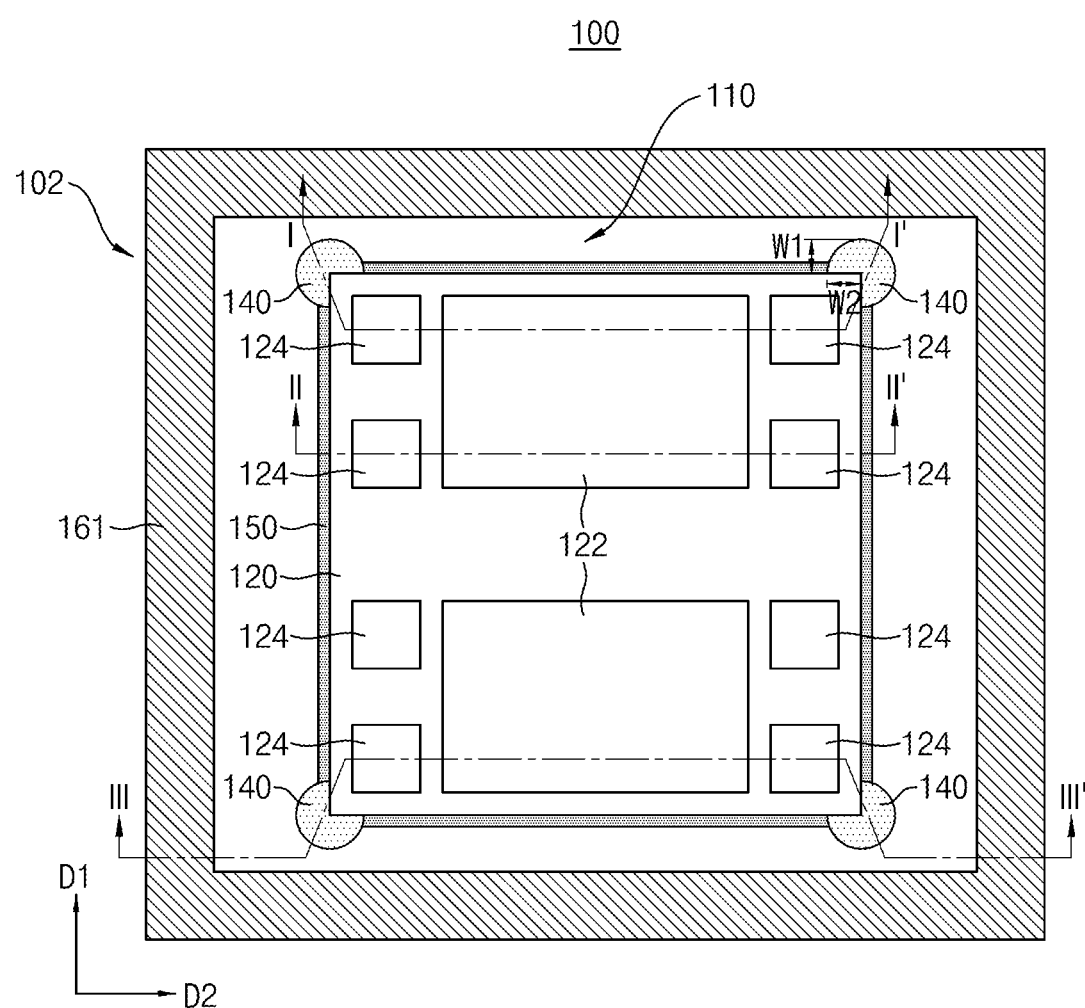
FIG. 1 is a layout of a package structure according to an example embodiment.

FIG. 1 is a layout of a package structure according to an example embodiment.

Figure 2:
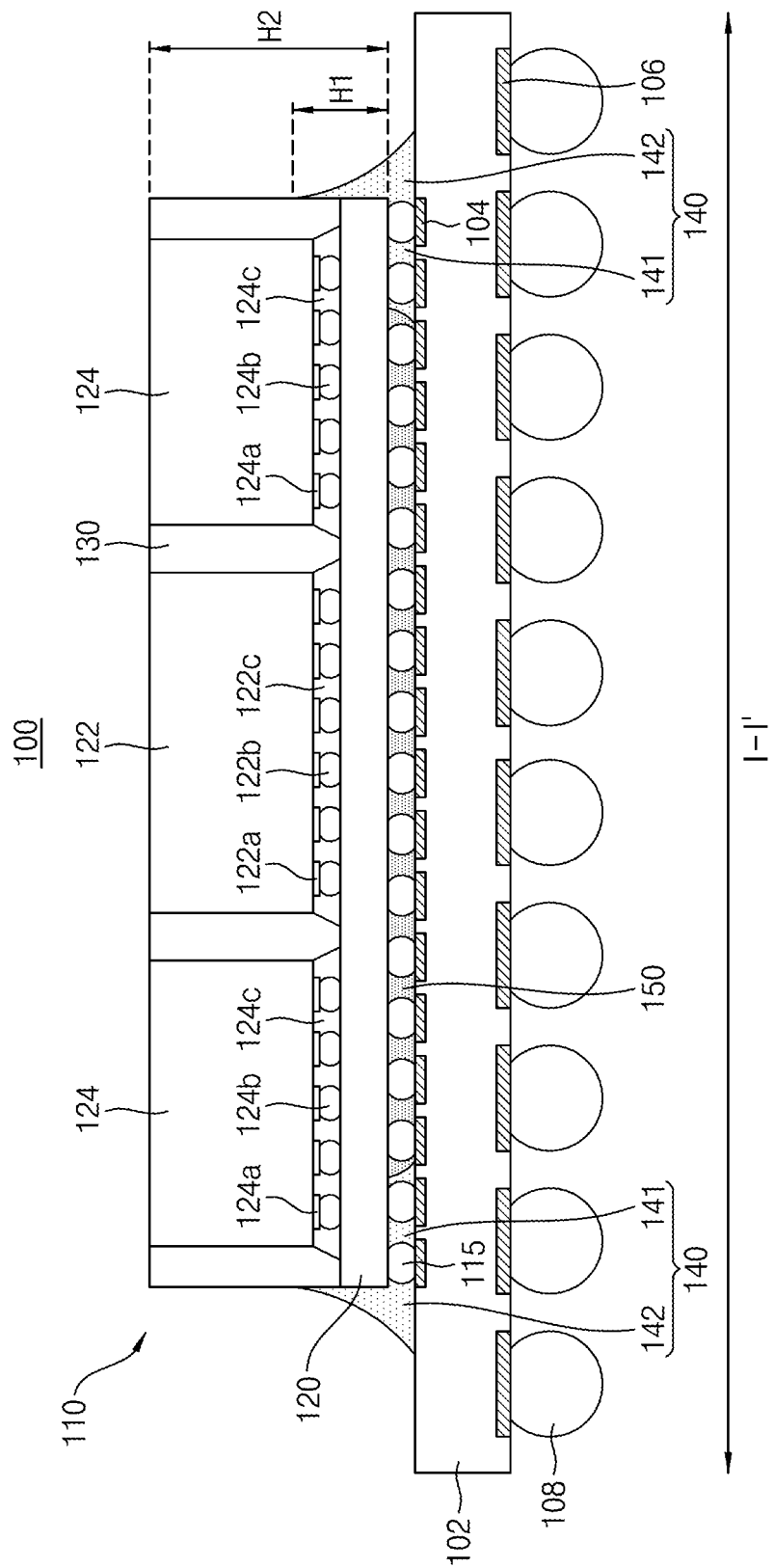
FIG. 2 is a vertical cross-sectional view along line I-I' of FIG. 1.
Figure 3:
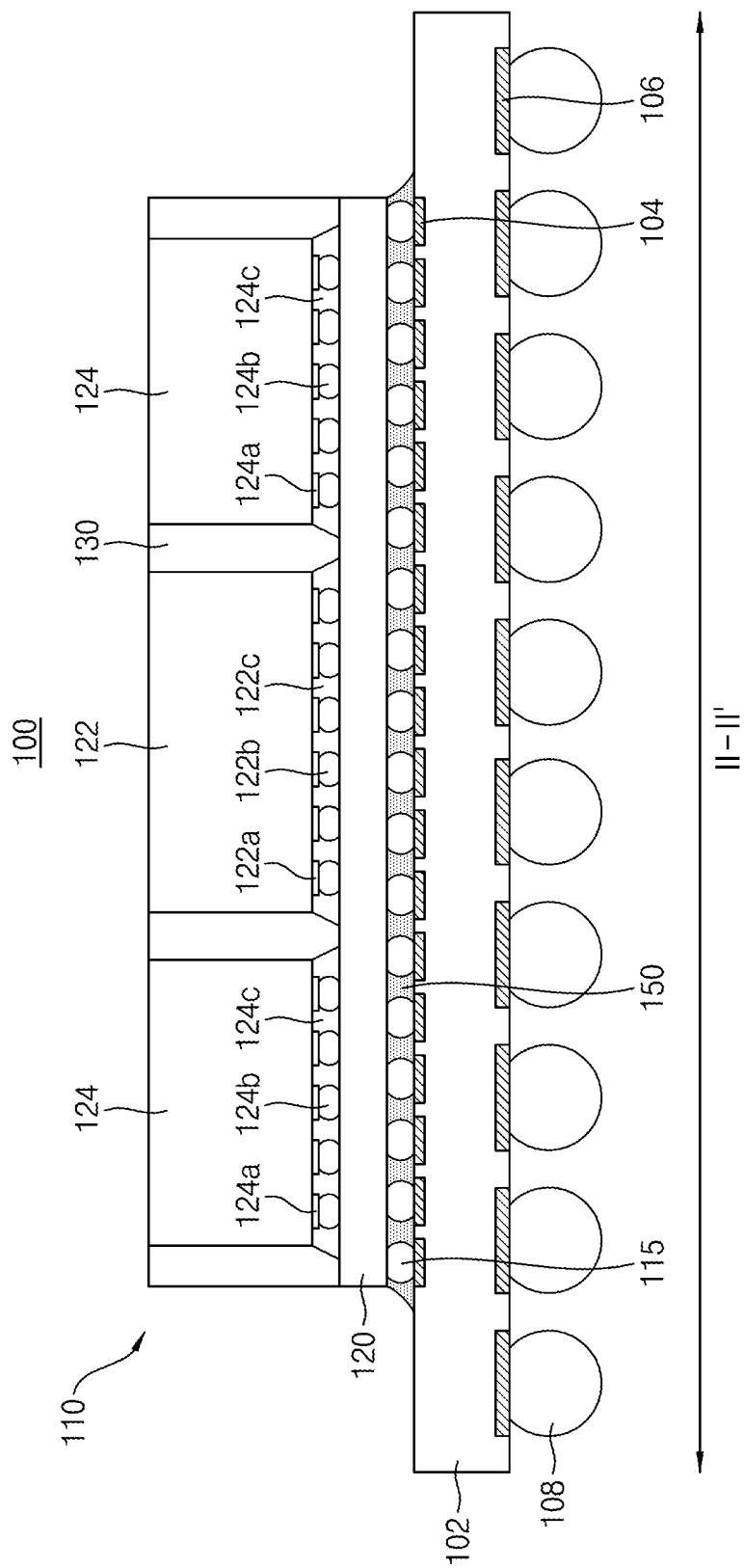
FIG. 3 is a vertical cross-sectional view along line II-II' of FIG. 1.

FIG. 2 is a vertical cross-sectional view taken along line I-I' of the package structure shown in FIG. 1. FIG. 3 is a vertical cross-sectional view taken along line II-II' of the package structure shown in FIG. 1.

Referring to FIGS. 1 to 3, a package structure 100 may include a lower substrate 102, a semiconductor package 110, substrate connection terminals 115, a first underfill 140, and a second underfill 150. The lower substrate 102 may include lower pads 106, upper pads 104, and external connection terminals 108.

In an example embodiment, the lower substrate 102 may be a printed circuit board (PCB) substrate. The lower substrate 102 may include at least one of, e.g., a phenol resin, an epoxy resin, and a polyimide. The lower substrate 102 may include, e.g., at least one of FR4, tetrafunctional epoxy, polyphenylene ether, epoxy/polyphenylene oxide, bismaleimide triazine, thermount, cyanate ester, polyimide, and liquid crystal polymer. The lower pads 106 and the upper pads 104 may be disposed on a lower surface and an upper surface of the lower substrate 102, respectively. The lower pads 106 may be electrically connected to the upper pads 104. The external connection terminals 108 may be disposed on the lower surface of the lower substrate 102 and may be connected to the lower pads 106. The upper pad 104 and the lower pad 106 may include metals, e.g., aluminum (Al), titanium (Ti), chromium (Cr), iron (Fe), cobalt (Co), copper (Cu), nickel (Ni), zinc (Zn), palladium (Pd), platinum (Pt), gold (Au), and silver (Ag).

The substrate connection terminals 115 may be disposed on the lower substrate 102, and the semiconductor package 110 may be disposed on the substrate connection terminals 115. For example, the substrate connection terminals 115 may be connected to the upper pads 104 of the lower substrate 102. The substrate connection terminals 115 may electrically connect the lower substrate 102 and the semiconductor package 110. The substrate connection terminal 115 may include at least one of, e.g., tin (Sn), indium (In), bismuth (Bi), antimony (Sb), copper (Cu), silver (Ag), gold (Au), zinc (Zn), and lead (Pb).

The semiconductor package 110 may include a package substrate 120, a first semiconductor chip 122, a second semiconductor chip 124, and a first encapsulant 130. In an example embodiment, the package substrate 120 may be an interposer. The interposer may include a through electrode therein. In an example embodiment, the package substrate 120 may include a redistribution layer.

The first semiconductor chip 122 and the second semiconductor chip 124 may be disposed on the package substrate 120. Referring further to FIG. 1, in a plan view, two first semiconductor chips 122 may be spaced apart along a first horizontal direction D1. Four second semiconductor chips 124 may be disposed around each of the first semiconductor chips 122. For example, a pair of the second semiconductor chips 124 may be disposed on opposite sides of the first semiconductor chips 122, e.g., two pairs of the second semiconductor chips 124 may be spaced apart from each other along a second horizontal direction D2. In an example embodiment, one first semiconductor chip 122 and four second semiconductor chips 124 adjacent to the first semiconductor chip 122 may be disposed on the package substrate 120.

The semiconductor package 110 may further include a first lower connection pad 122a, a first connection terminal 122b, and a first underfill material layer 122c disposed under the first semiconductor chip 122. The first lower connection pad 122a may be disposed on the lower surface of the first semiconductor chip 122, and the first lower connection pad 122a may be connected to the package substrate 120 through the first connection terminal 122b. The first underfill material layer 122c may fill the space between the first semiconductor chip 122 and the package substrate 120 and may cover the first lower connection pad 122a and the first connection terminal 122b. The first underfill material layer 122c may protect the first connection terminal 122b.

The semiconductor package 110 may further include a second lower connection pad 124a, a second connection terminal 124b, and a second underfill material layer 124c disposed under the second semiconductor chip 124. The second lower connection pad 124a may be disposed on the lower surface of the second semiconductor chip 124, and the second lower connection pad 124a may be connected to the package substrate 120 through the second connection terminal 124b. The second underfill material layer 124c may fill the space between the second semiconductor chip 124 and the package substrate 120 and may cover the second lower connection pad 124a and the second connection terminal 124b. The second underfill material layer 124c may protect the second connection terminal 124b.

The first lower connection pad 122a and the second lower connection pad 124a may include metal, e.g., at least one of Al, Ti, Cr, Fe, Co, Ni, Cu, Zn, Pd, Pt, Au, and Ag. The first connection terminal 122b and the second connection terminal 124b may include, e.g., at least one of Sn, In, Bi, Sb, Cu, Ag, Au, Zn, and Pb. The first underfill material layer 122c and the second underfill material layer 124c may include, e.g., epoxy resin or silicone resin.

The first semiconductor chip 122 may include an application processor (AP) chip, e.g., a microprocessor or a microcontroller, and a logic chip, e.g., a central processing unit (CPU), a graphic processing unit (GPU), a modem, an application-specific integrated circuit (ASIC), and a field programmable gate array (FPGA). The second semiconductor chip 124 may include a volatile memory, e.g., a dynamic random access memory (DRAM) or static random access memory (SRAM), and a non-volatile memory, e.g., a phase-change random access memory (PRAM), a magnetoresistive random access memory (MRAM), a ferroelectric random access memory (FeRAM), or Resistive Random Access Memory (RRAM).

The first encapsulant 130 may cover an upper surface of the package substrate 120 and side surfaces of the first semiconductor chip 122 and the second semiconductor chip 124. Upper surfaces of the first and second semiconductor chips 122 and 124 may be exposed without being covered by the first encapsulant 130. The upper surface of the first semiconductor chip 122 and the upper surface of the second semiconductor chip 124 may be positioned at the same level. A side surface of the first encapsulant 130 may be coplanar with a side surface of the package substrate 120, e.g., an outermost side surface of the first encapsulant 130 on an outermost side surface of the second semiconductor chip 124 may be coplanar with an outermost side surface of the package substrate 120. The first encapsulant 130 may be a resin including, e.g., epoxy or polyimide. For example, the first encapsulant 130 may include a bisphenol-group epoxy resin, a polycyclic aromatic epoxy resin, an o-cresol novolac epoxy resin, a biphenyl-based epoxy resin, or a naphthalene-based epoxy resin.

The first underfill 140 and the second underfill 150 may fill a space between the lower substrate 102 and the semiconductor package 110, and may cover the substrate connection terminals 115. The first underfill 140 and the second underfill 150 may include an epoxy resin or a silicone resin. In addition, the first underfill 140 and the second underfill 150 may further include a filler, e.g., silica.

In an example embodiment, the first underfill 140 may cover the plurality of substrate connection terminals 115. Referring to FIG. 1, in a plan view, the first underfill 140 may cover a corner portion of the semiconductor package 110, e.g., the first underfill 140 may include separate and discrete segments that are only at respective corner portions of the semiconductor package 110. In a plan view, the maximum distance from a side surface of the semiconductor package 110 to an edge of the first underfill 140 along the first direction D1, i.e., a distance W1, may be about 1 mm or less. For example, as illustrated in FIG. 1, the maximum distance from an outer side surface of the semiconductor package 110 to an outermost edge of the first underfill 140, i.e., the distance W1, may be a width of a portion of the first underfill 140 that extends beyond, e.g., outside, the edge of the semiconductor package 110 in the first and/or second directions D1 and/or D2. For example, the distance W1 along the first horizontal direction D1 from the side surface of the semiconductor package 110 to the edge of the first underfill 140 may be 1 mm or less. In a plan view, a length W2 of a portion of the side surface of the semiconductor package 110 covered, e.g., overlapped, by the first underfill 140 may be less than ⅓ of the length of the side surface of the semiconductor package 110, e.g., the length W2 on each side of the semiconductor package 110 may be less than ⅓ of a total length of a corresponding side surface of the semiconductor package 110 along the first direction D1 or the second direction D2.

Referring to FIG. 2, in a longitudinal sectional view, the first underfill 140 may include an inner portion 141 and an outer portion 142. The inner portion 141 is a portion of the first underfill 140 between the lower substrate 102 and the semiconductor package 110 and refers to the portion that overlaps the semiconductor package 110 in a vertical direction, e.g., the inner portion 141 may have the length W2 along the first and/or the second directions D1 and/or D2. The inner portion 141 may overlap at least one of the substrate connection terminals 115 between the lower substrate 102 and the semiconductor package 110, e.g., the inner portion 141 may overlap at least one of the substrate connection terminals 115 at each corner of the semiconductor package 110. The outer portion 142 may be continuous and integral with the inner portion 141, i.e., the inner and outer portions 141 and 142 may be formed simultaneously of the same material, and refers to a portion of the first underfill 140 that does not overlap the semiconductor package 110. For example, the outer portion 142 is exposed outside of the semiconductor package 110, e.g., a portion of the outer portion 142 may have a length corresponding to the distance W1.

The first underfill 140 may contact a lower surface of the semiconductor package 110 and may partially cover the side surface of the semiconductor package 110. For example, the inner portion 141 may contact the package substrate 120 of the semiconductor package 110. In addition, the inner portion 141 may cover, e.g., at least some of, the plurality of substrate connection terminals 115, e.g., to improve protection of corner area and substrate connection terminals 115 adjacent to the corner areas from external impacts. The outer portion 142 may cover a side surface of the package substrate 120 and a portion of the side surface of the first encapsulant 130.

Figure 9:
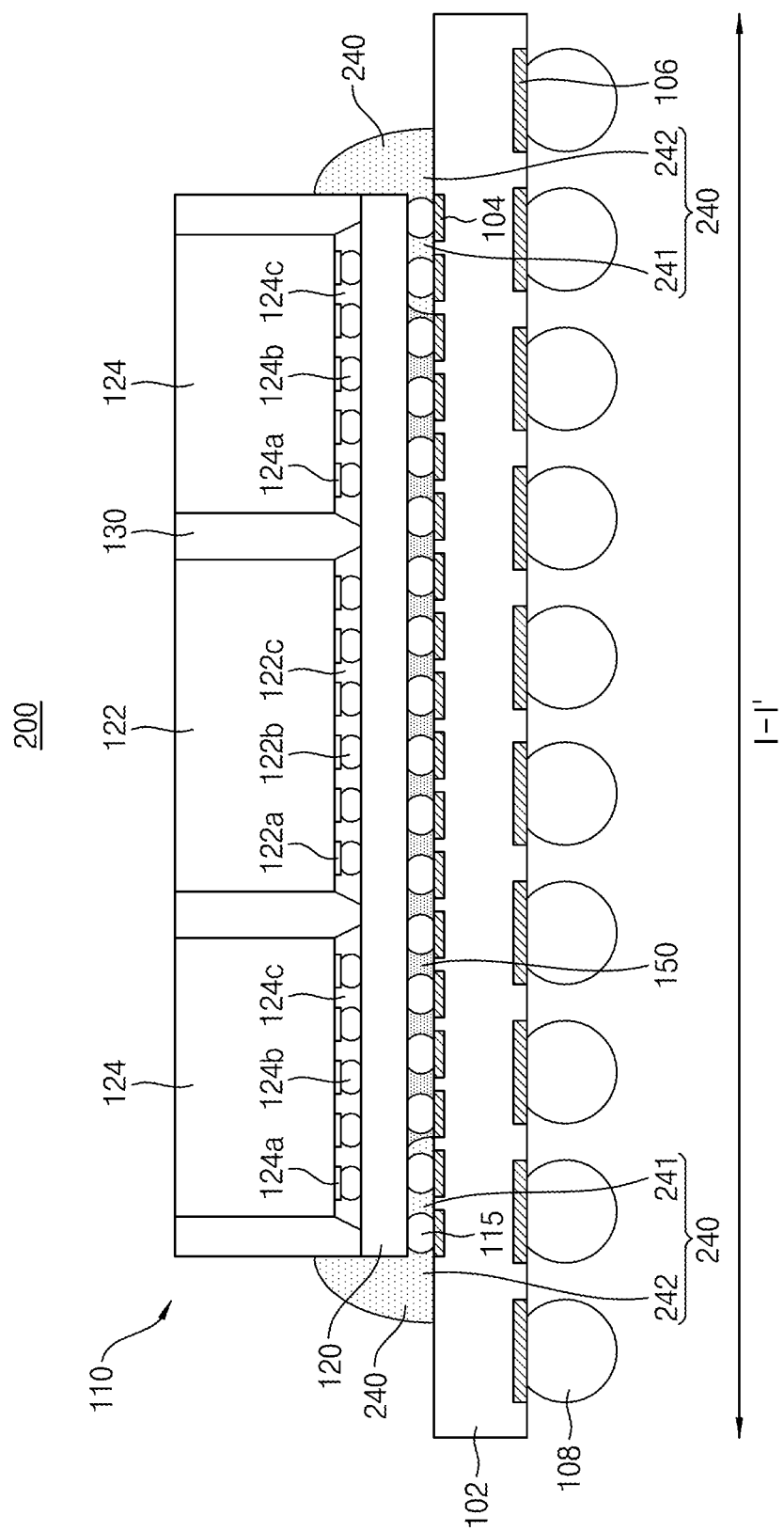
FIG. 9 is a vertical cross-sectional of a package structure according to an example embodiment.

For example, as illustrated in FIG. 2, side surfaces of the inner portion 141 and the side surfaces of the outer portion 142 may have a concave cross-section. In another example, as illustrated in FIG. 9, a package structure 200 with a first underfill 240 may have an inner portion 241 and an outer portion 242 with side surfaces having a convex cross-section. In an example embodiment, as illustrated in FIG. 2, the height H1 of a portion of the semiconductor package 110 covered by the outer portion 142 may be about 80% or less of the height H2 of the semiconductor package 110.

Referring to FIG. 1, in a plan view, the second underfill 150 may surround side surfaces of a semiconductor package 110. Referring to FIGS. 2 and 3, in a longitudinal cross-sectional view, the second underfill 150 may partially cover the lower surface of the semiconductor package 110. The second underfill 150 may be located inside the first underfill 140, e.g., the second underfill 150 may extend between corner portions of the first underfill 140 (FIG. 1). For example, as illustrated in FIG. 2, the second underfill 150 may contact the inner side, i.e., an inner side surface of the inner portion 141, of the first underfill 140. An uppermost surface of the second underfill 150 may be located at a lower level than an uppermost end of the outer portion 142 of the first underfill 140, and a lowermost surface of the second underfill 150 is coplanar with a lowermost surface of the first underfill 140. In one embodiment, the height of the second underfill 150, e.g., between the uppermost surface and the lowermost surface, may be about 40 μm to about 100 μm.

The first underfill 140 may have different physical properties from the second underfill 150, e.g., the first and second underfills 140 and 150 may be formed of different materials that exhibit different physical properties from each other. For example, the first underfill 140 may have a greater coefficient of thermal expansion and a lower modulus of elasticity relative to the second underfill 150, in order to better absorb external shocks at corner portions.

In an example embodiment, the coefficient of thermal expansion (CTE) of the first underfill 140 may be greater than the coefficient of thermal expansion of the second underfill 150 by 50% or more. For example, the CTE ($\alpha$1) of the first underfill 140 may be about 50 ppm/° C. to about 500 ppm/° C., and the CTE ($\alpha$1) of the second underfill 150 may be about 10 ppm/° C. to about 40 ppm/° C. In another example, the CTE ($\alpha$2) of the first underfill 140 may be about 500 ppm/° C. or higher, and the CTE ($\alpha$2) of the second underfill 150 may be about 60 ppm/° C. to about 200 ppm/° C. Here, CTE ($\alpha$1) means the coefficient of thermal expansion at a temperature lower than the glass transition temperature (Tg), and CTE ($\alpha$2) means the coefficient of thermal expansion at a temperature higher than the glass transition temperature. The glass transition temperature of the first underfill 140 and the second underfill 150 may be about 80° C. to about 200° C.

In an example embodiment, the modulus (modulus of elasticity) of the first underfill 140 may be about 50% or less than the modulus of the second underfill 150. For example, the modulus $\alpha$1 of the first underfill 140 may be 1 GPa or less, and the modulus $\alpha$1 of the second underfill 150 may be 5 GPa or more. In an example embodiment, the elongation of the first underfill 140 may be greater than the elongation of the second underfill 150 by 50% or more. For example, the elongation of the first underfill 140 may be 10% or more, and the elongation of the second underfill 150 may be 5% or less. In an example embodiment, the filler content of the first underfill 140 may be lower than the filler content of the second underfill 150. For example, the filler content of the first underfill 140 may be about 40 wt % or less, based on a total weight of the first underfill 140, and the filler content of the second underfill 150 may be about 45 wt % to about 60 wt %, based on a total weight of the second underfill 150. As described above, the first underfill 140 may have different physical properties from the second underfill 150 and may easily absorb external shocks. Accordingly, the first underfill 140 may prevent and reduce the occurrence of cracks of the underfill at the corner portion of the semiconductor package 110.

Figure 4:
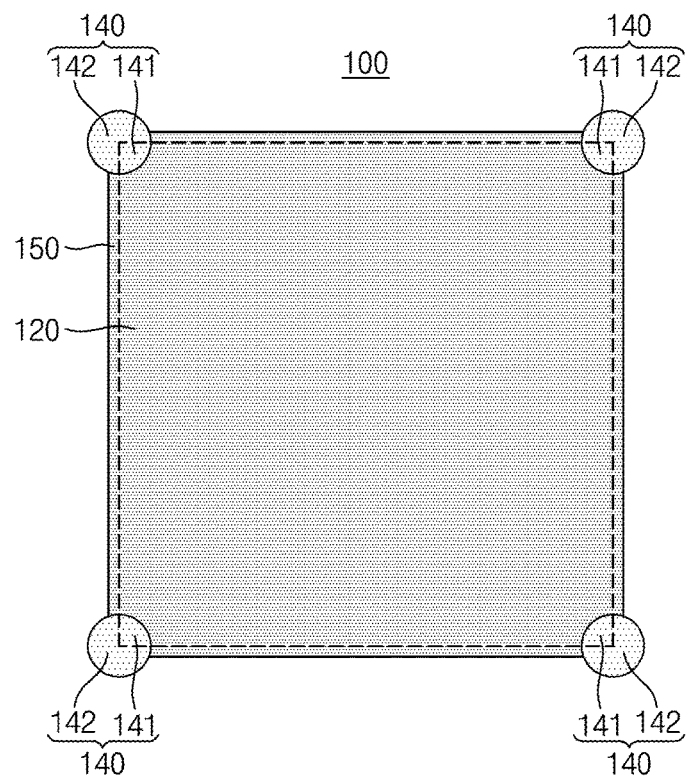
FIG. 4 is a plan view of the package structure shown in FIG. 1.

FIG. 4 is a plan view of the package structure 100 shown in FIG. 1. In detail, FIG. 4 is a plan view from a bottom of the package structure 100.

Referring to FIG. 4, the first underfill 140 and the second underfill 150 may overlap the package substrate 120 (dashed frame in FIG. 4) in the vertical direction. For example, the inner portion 141 of the first underfill 140 and the second underfill 150 may overlap the package substrate 120 in the vertical direction. In an example embodiment, the total area of the inner portions 141 of the first underfills 140 may be about 40% or less of the area of the bottom of the package substrate 120. In an example embodiment, the area of the bottom of the package substrate 120 may be about 1500 mm$^2$ or more.

Figure 5:
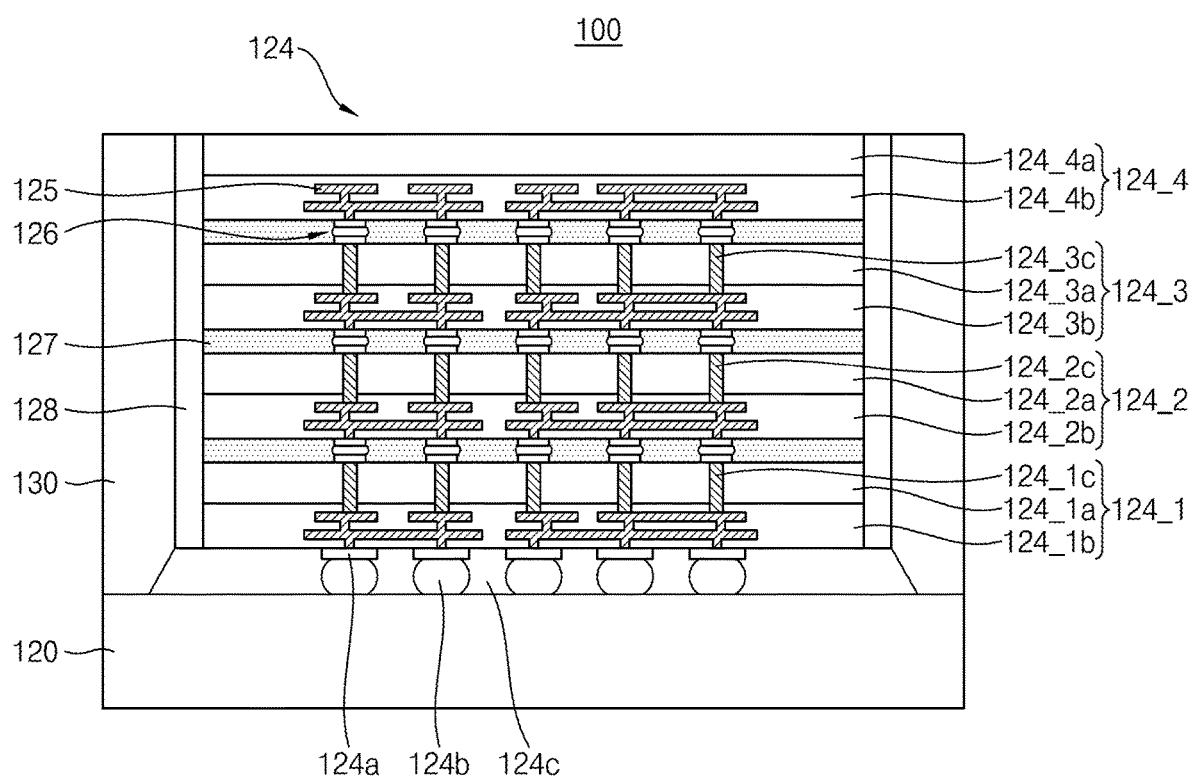
FIG. 5 is an enlarged view of the package structure shown in FIG. 1.

FIG. 5 is an enlarged view of the second semiconductor chip 124 in the package structure 100 shown in FIG. 1. In detail, FIG. 5 illustrates the package substrate 120, the second semiconductor chip 124, and the first encapsulant 130.

Referring to FIG. 5, in an example embodiment, the second semiconductor chip 124 may be a High Bandwidth Memory (HBM) DRAM. The second semiconductor chip 124 may include a first memory chip 124_1, a second memory chip 124_2, a third memory chip 124_3, and a fourth memory chip 124_4. Each of the first memory chip 124_1, the second memory chip 124_2, the third memory chip 124_3, and the fourth memory chip 124_4 may include an internal wiring 125. The second semiconductor chip 124 may further include a chip connection terminal 126, an adhesive layer 127, and a second encapsulant 128.

The first memory chip 124_1, the second memory chip 124_2, the third memory chip 124_3, and the fourth memory chip 124_4 may be vertically stacked. The first memory chip 124_1 may be disposed on the second lower connection pad 124a and the second underfill material layer 124c, and may include a first substrate 124_1a, a first device layer 124_1b, and a first through electrode 124_1c. The first substrate 124_1a may be disposed on the first device layer 124_1b and may include the first through electrode 124_1c therein. The first device layer 124_1b may include the internal wiring 125 therein. The internal wiring 125 of the first device layer 124_1b may be connected to the second lower connection pad 124a and the first through electrode 124_1c. The first through electrode 124_1c may be connected to the chip connection terminal 126.

The second memory chip 124_2 may be disposed on the first memory chip 124_1, and may include a second substrate 124_2a, a second device layer 124_2b, and a second through electrode 124_2c. The second substrate 124_2a may include the second through electrode 124_2c therein, and the second device layer 124_2b may include the internal wiring 125 therein. The internal wiring 125 of the second device layer 124_2b may be connected to the chip connection terminal 126 and the second through electrode 124_2c.

The third memory chip 124_3 may be disposed on the second memory chip 124_2 and may include a third substrate 124_3a, a third device layer 124_3b, and a third through electrode 124_3c. The third substrate 124_3a may include the third through electrode 124_3c therein, and the third device layer 124_3b may include the internal wiring 125 therein. The internal wiring 125 of the second device layer 124_2b may be connected to the chip connection terminal 126 and the third through electrode 124_3c.

The fourth memory chip 124_4 may be disposed on the third memory chip 124_3 and may include a fourth substrate 124_4a and a fourth device layer 124_4b. The fourth device layer 124_4b may include the internal wiring 125 therein. The internal wiring 125 of the fourth device layer 124_4b may be connected to the chip connection terminal 126. The fourth memory chip 124_4 may not include a through electrode, and an upper surface of the fourth memory chip 124_4 may be exposed.

The adhesive layer 127 is formed between the first memory chip 124_1 and the second memory chip 124_2, between the second memory chip 124_2 and the third memory chip 124_3, and between the third memory chip 124_3 and the fourth memory chip 124_4. The adhesive layer 127 may surround the chip connection terminal 126. The adhesive layer 127 may include, e.g., a thermosetting resin, a thermoplastic resin, or a UV curable resin. The adhesive layer 127 may include, e.g., at least one of a bisphenol type epoxy resin, a novolac type epoxy resin, a phenol resin, a urea resin, a melamine resin, an unsaturated polyester resin, and a resorcinol resin.

The second encapsulant 128 may cover side surfaces of the first memory chip 124_1, the second memory chip 124_2, the third memory chip 124_3, the fourth memory chip 124_4, and the adhesive layers 127. A side surface of the second encapsulant 128 may be covered by the first encapsulant 130. The second encapsulant 128 may include the same material as the first encapsulant 130. An upper surface of the second encapsulant 128 may be coplanar with the upper surface of the fourth memory chip 124_4.

Figure 6:
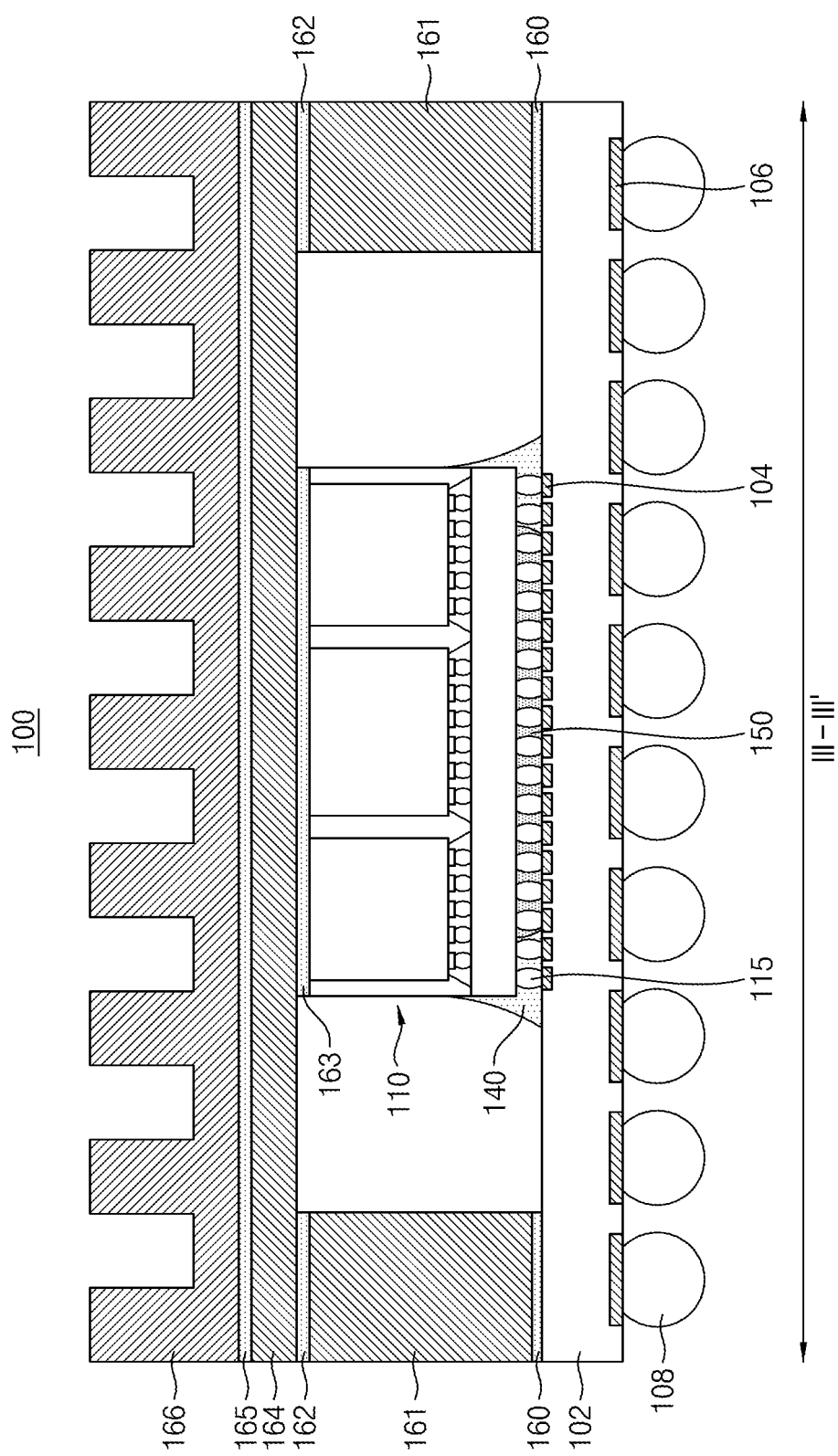
FIG. 6 is a vertical cross-sectional view along line of FIG. 1.

FIG. 6 is a vertical cross-sectional view taken along line of the package structure 100 shown in FIG. 1.

Referring to FIG. 6, the package structure 100 may further include a first heat transfer material 160, a stiffener 161, a second heat transfer material 162, a third heat transfer material 163, a heat spreader 164, a fourth heat transfer material 165, and a heat sink 166 disposed on the lower substrate 102.

The stiffener 161 may be disposed on the first heat transfer material 160, and the first heat transfer material 160 may attach and fix the stiffener 161 on the lower substrate 102. Referring to FIG. 1, the stiffener 161 may extend along the periphery of the lower substrate 102. For example, in a plan view, the stiffener 161 may have a frame shape. The stiffener 161 may prevent the lower substrate 102 from being warped, and may transfer heat from the lower substrate 102 to the heat spreader 164.

The second heat transfer material 162 and the third heat transfer material 163 may be disposed on the stiffener 161 and the semiconductor package 110. The heat spreader 164 may be disposed on the second heat transfer material 162 and the third heat transfer material 163. The second heat transfer material 162 and the third heat transfer material 163 may transfer heat from the semiconductor package 110 to the heat spreader 164. The heat spreader 164 may include a material with high thermal conductivity. For example, the heat spreader 164 may include Ag, Cu, Ni, Au, or a combination thereof. The fourth heat transfer material 165 may be disposed on the heat spreader 164, and the heat sink 166 may be disposed on the fourth heat transfer material 165. The heat sink 166 may discharge heat inside the semiconductor package 110 to the outside. The heat sink 166 may include a plurality of grooves to dissipate heat more efficiently. The fourth heat transfer material 165 may transfer heat from the heat spreader 164 to the heat sink 166. The first to fourth heat transfer materials 160, 162, 163, and 165 may include a thermal interface material (TIM) including, e.g., a polymer, resin, or an epoxy and a filler. Fillers may include dielectric fillers, e.g., aluminum oxide, magnesium oxide, aluminum nitride, boron nitride, and diamond powder. The filler may also be a metal filler, e.g., silver, copper, aluminum and the like. The heat spreader 164 may include metal, e.g., Cu. The heat sink 166 may include, e.g., a metal-based material, a ceramic-based material, a carbon-based material, or a polymer-based material.

Figure 7:
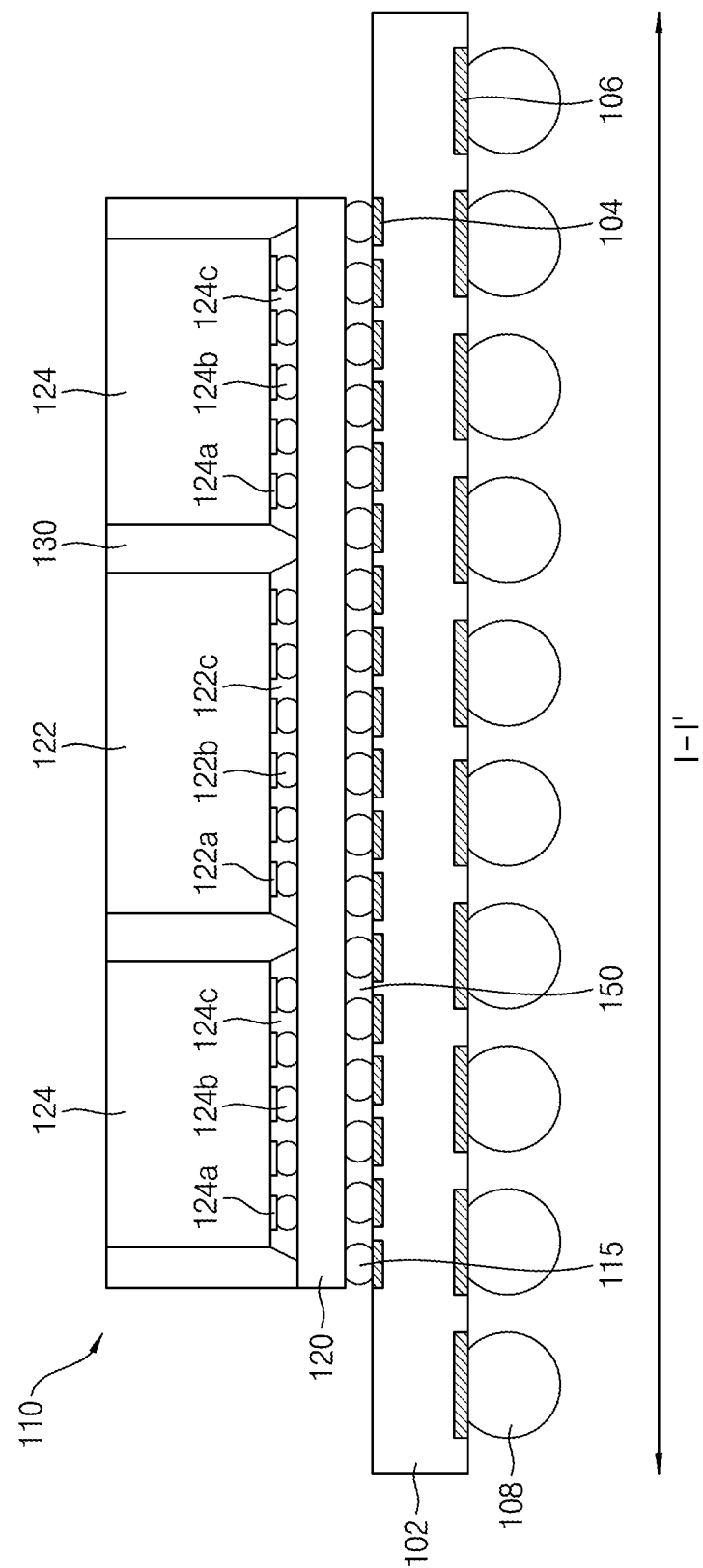
FIGS. 7-8 are vertical cross-sectional views illustrating stages in a method of manufacturing a package structure according to an example embodiment.
Figure 8:
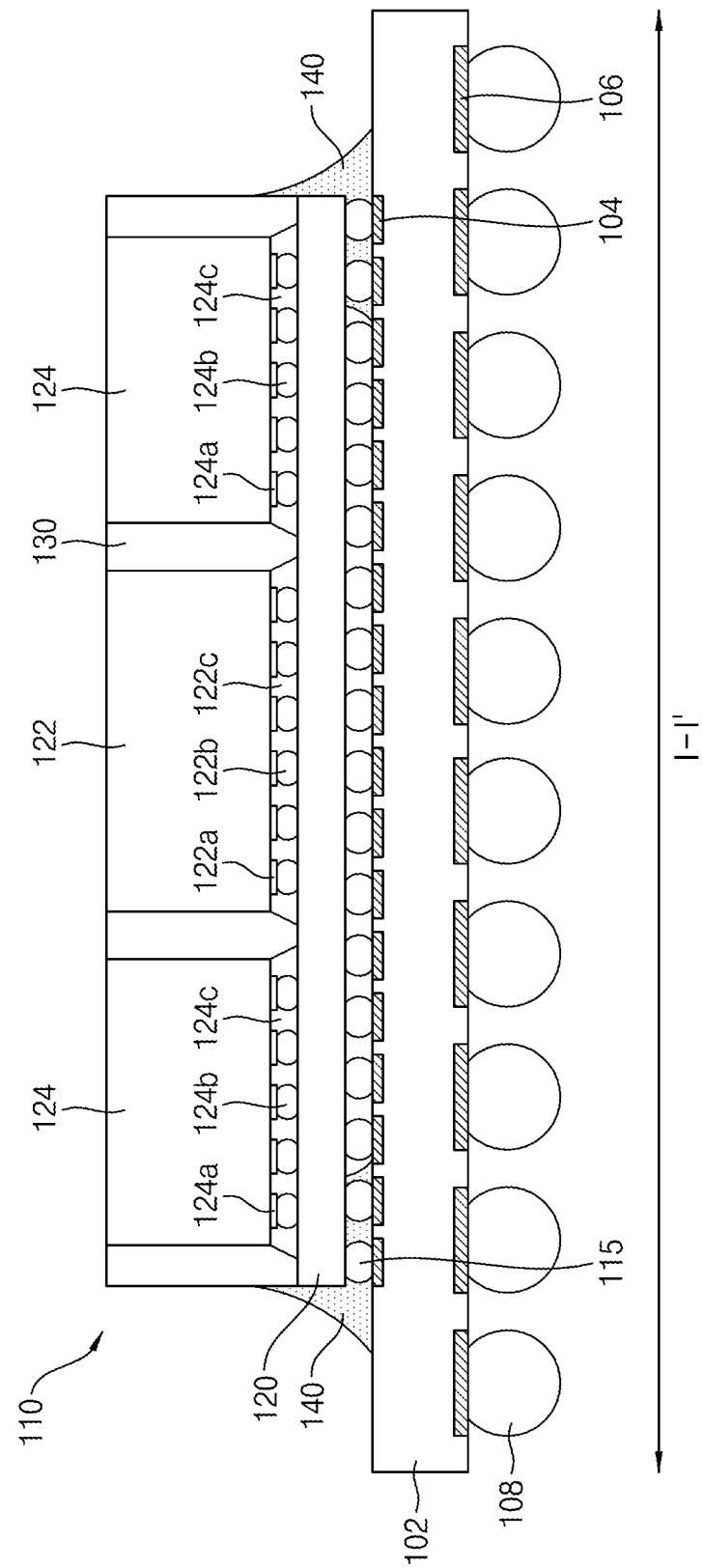

FIGS. 7 and 8 are vertical cross-sectional views illustrating stages in a method of manufacturing a package structure according to an example embodiment. The cross-sectional views correspond to FIG. 2.

Referring to FIGS. 2, 7, and 8, forming the package structure 100 may include forming the semiconductor package 110 on the lower substrate 102, forming the first underfill 140 between the lower substrate 102 and the semiconductor package 110, and forming the second underfill 150 between the lower substrate 102 and the semiconductor package 110.

In detail, referring to FIG. 7, the semiconductor package 110 may be formed on the lower substrate 102. The semiconductor package 110 may be connected to the upper pads 104 disposed on the upper surface of the lower substrate 102 by substrate connection terminals 115. The semiconductor package 110 may include the package substrate 120, the first semiconductor chip 122, the second semiconductor chip 124, and the first encapsulant 130.

Referring to FIG. 8, the first underfill 140 may be formed. Forming the first underfill 140 may include forming a first underfill material between the lower substrate 102 and the semiconductor package 110, and curing the first underfill material. Referring further to FIG. 1, the first underfill material may be formed, e.g., only, at a corner portion of the semiconductor package 110, and a portion of the side surface of the semiconductor package 110, i.e., the side surface portion between the corner portions, may not be covered by the first underfill material. The first underfill material may be cured by a curing process to form the first underfill 140. The first underfill 140 may partially cover a lower surface and the side surface of the semiconductor package 110. The first underfill 140 may cover, e.g., at least some of, the plurality of substrate connection terminals 115.

Referring back to FIG. 2, the second underfill 150 may be formed. Forming the second underfill 150 may include forming a second underfill material between the lower substrate 102 and the semiconductor package 110 and curing the second underfill material. Referring further to FIG. 1, the second underfill material may be formed under the semiconductor package 110. The second underfill material may be cured by a curing process to form the second underfill 150. The second underfill 150 may be located inside, e.g., within an area surrounded by, the first underfill 140.

As shown in FIGS. 7 and 8, by forming the first underfill 140 at the corners of the semiconductor package 110, before forming the second underfill 150, the first underfill 140 may be arranged to surround the corners of the semiconductor package 110. As described above, the first underfill 140 has a physical property that easily absorbs impact. Accordingly, since the first underfill 140 protects the corner portions of the semiconductor package 110 that is vulnerable to impact, occurrence of cracks in the package structure 100 may prevented or substantially reduced.

Figure 10:
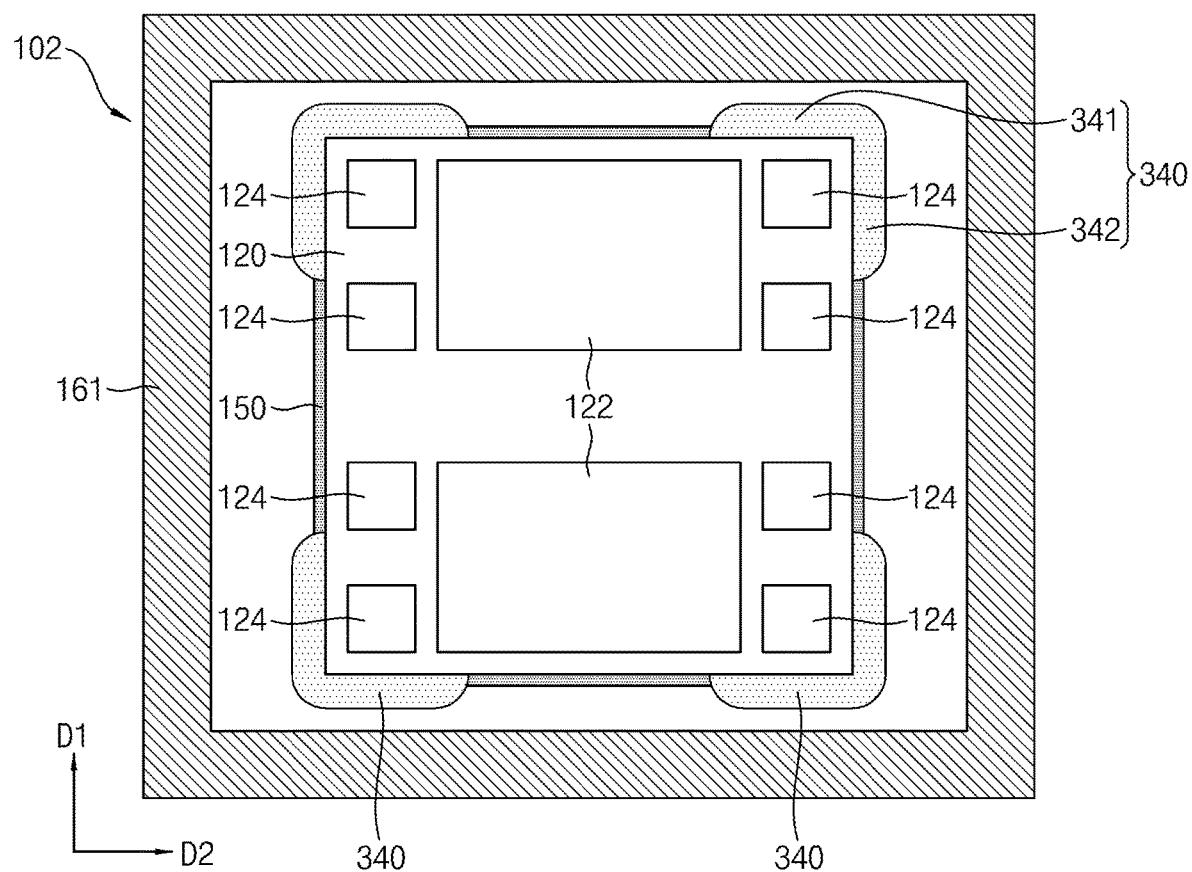
FIGS. 10-11 are layouts of package structures according to example embodiments.
Figure 11:
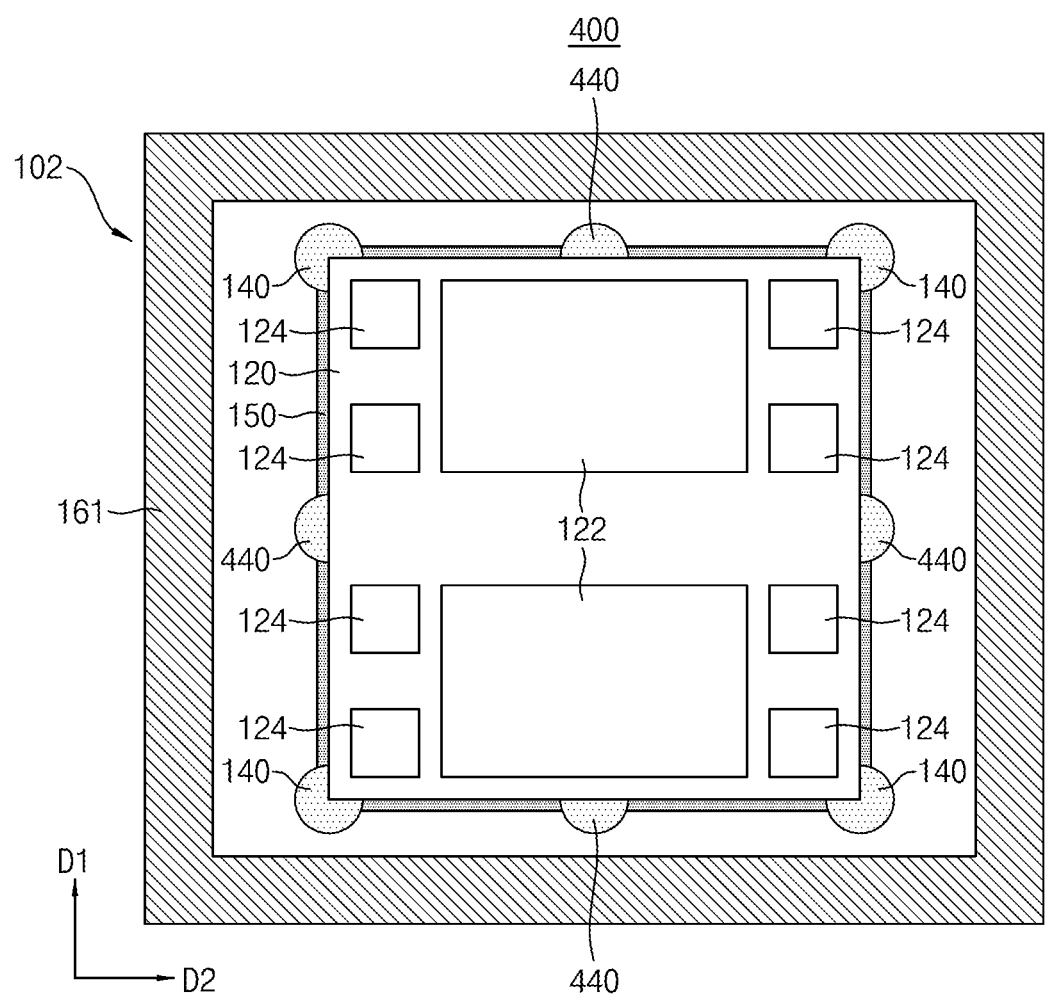

FIGS. 10-11 are layouts of package structures according to example embodiments.

Referring to FIG. 10, a package structure 300 may include a first underfill 340 and a second underfill 150 disposed under the semiconductor package 110. In an example embodiment, when viewed in a plan view, the first underfill 340 may cover corner portions and side surfaces of the semiconductor package 110. For example, the first underfill 340 may include a first extension portion 341 extending in the first horizontal direction D1 and a second extension portion 342 extending in the second horizontal direction D2. The first extension portion 341 and the second extension portion 342 may be integrally formed. The first extension portion 341 and the second extension portion 342 may partially cover the side surface of the semiconductor package 110. For example, a length of a portion of the side surface of the semiconductor package 110 covered by the first extension portion 341 may be less than ⅓ of the length of the side surface of the semiconductor package 110. In addition, a length of a portion of the side surface of the semiconductor package 110 covered by the second extension portion 342 may be less than ⅓ of the length of the side surface of the semiconductor package 110.

Referring to FIG. 11, a package structure 400 may include first underfills 140, a second underfill 150, and a third underfill 440 disposed under the semiconductor package 110. In an example embodiment, when viewed from a plan view, the first underfills 140 may cover corner portions of the semiconductor package 110, and the third underfill 440 may partially cover the side surface of the semiconductor package 110. For example, one first underfill 140 may be disposed at each corner portion of the semiconductor package 110, and one first underfill 140 may be disposed at each, e.g., center of a, side surface of the semiconductor package 110. In an example embodiment, two or more first underfills 140 may be disposed on each side surface of the semiconductor package 110. In a plan view, the second underfill 150 is disposed between the first underfill 140 and the third underfill 440 and may cover the, e.g., portions of, side surfaces of the semiconductor package 110.

In an example embodiment, the third underfill 440 may include the same material as the first underfill 140. The first underfill 140 and the third underfill 440 may prevent and reduce the occurrence of cracks in the package structure 400.

Figure 12:
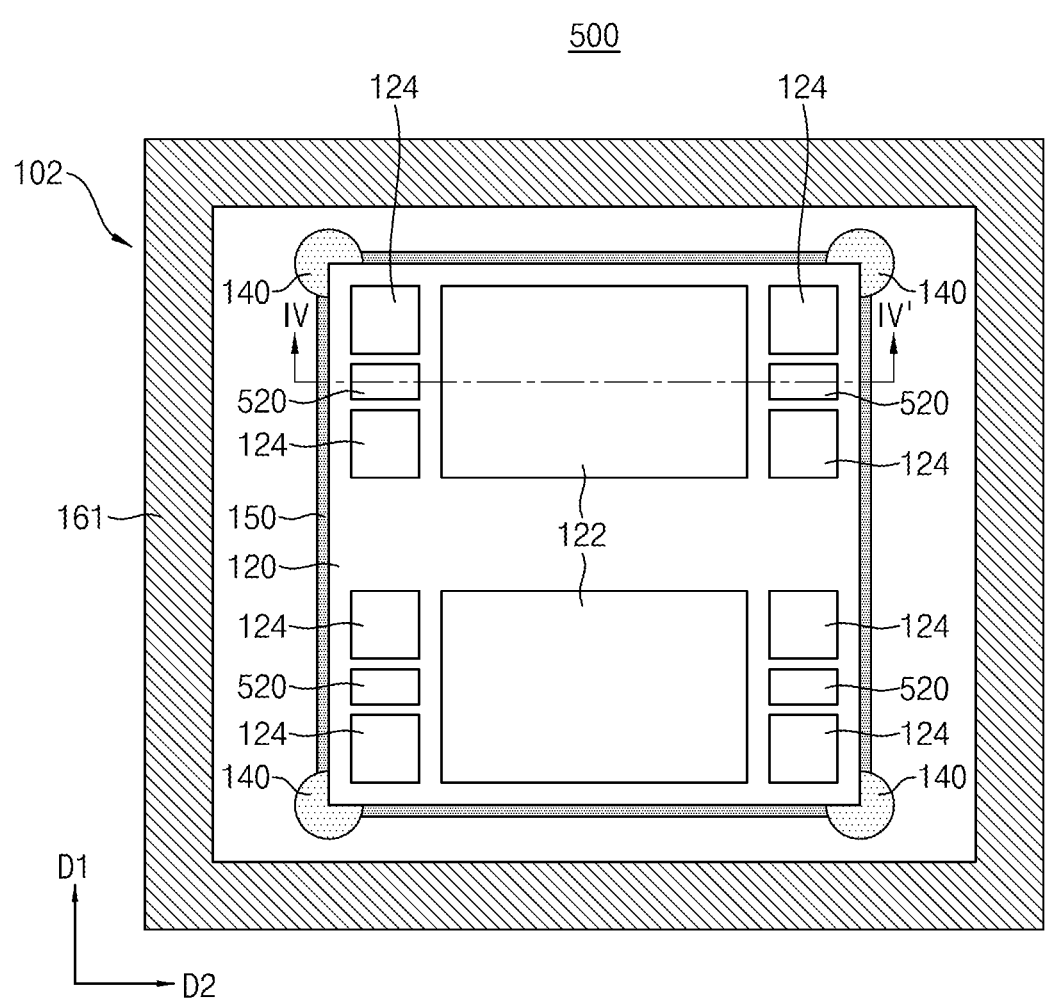
FIG. 12 is a layout of a package structure according to an example embodiment.
Figure 13:
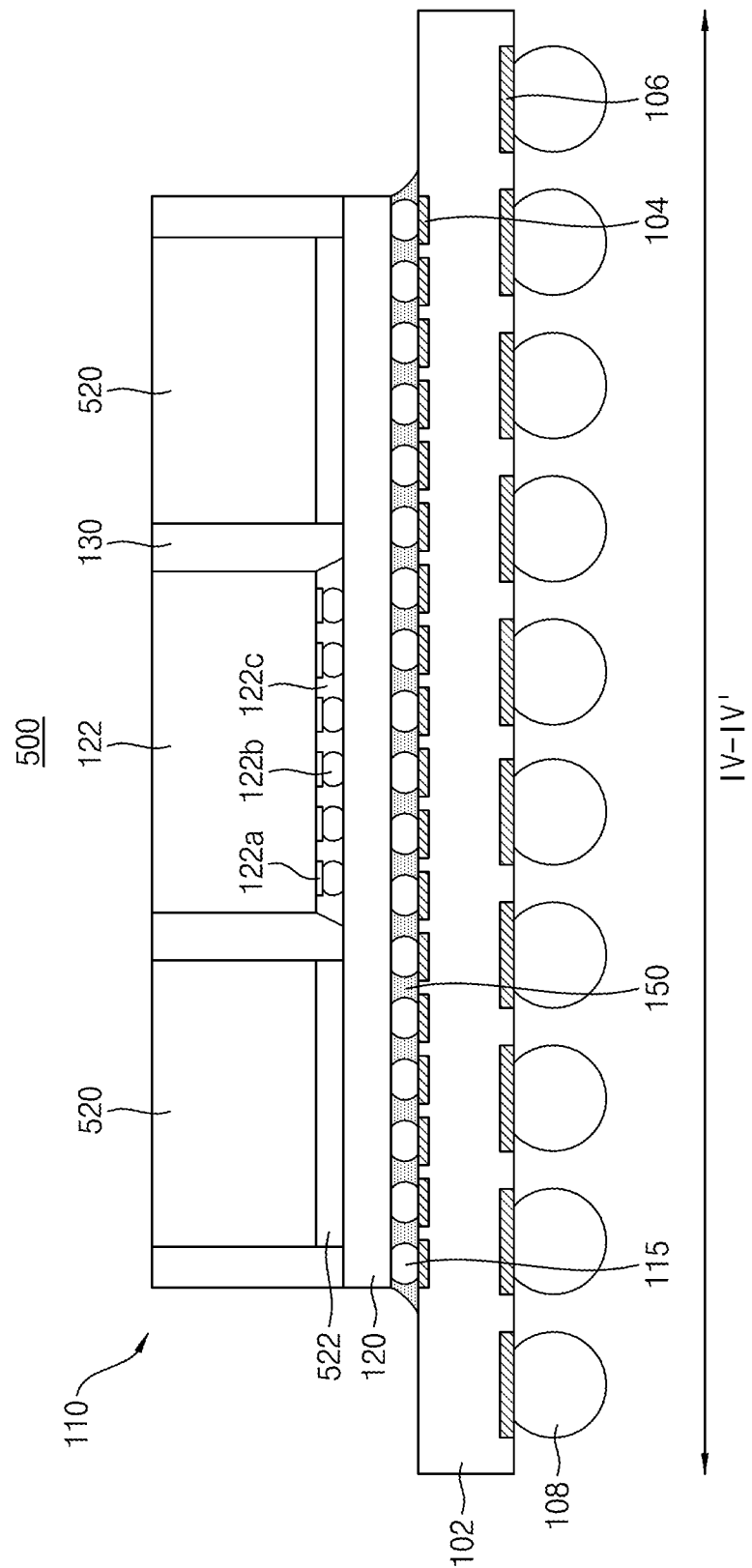
FIG. 13 is a vertical cross-sectional view along line IV-IV' of FIG. 12.

FIG. 12 is a layout of a package structure according to an example embodiment. FIG. 13 is a vertical cross-sectional view taken along line IV-IV' of the package structure shown in FIG. 12.

Referring to FIGS. 12 and 13, a semiconductor package 110 of a package structure 500 may further include a dummy chip 520 disposed between the first semiconductor chip 122 and the second semiconductor chip 124, e.g., the dummy chip 520 may be adjacent to the first semiconductor chip 122 and between two second semiconductor chips 124. For example, in a plan view, the dummy chip 520 may be disposed between the first semiconductor chips 122. The dummy chip 520 may be attached to the package substrate 120 by an adhesive layer 522. An upper surface of the dummy chip 520 may be positioned at the same level as the upper surfaces of the first semiconductor chip 122 and the second semiconductor chip 124, but is not limited thereto. In an example embodiment, the upper surface of the dummy chip 520 may be located at a lower level than the upper surfaces of the first and second semiconductor chips 122 and 124. The dummy chip 520 may prevent and reduce warpage of the semiconductor package 110.

By way of summation and review, according to the example embodiments, a package structure includes a first underfill at corner portions, e.g., including at least some of the substrate connection terminals, and a second underfill between the corner portions. Since the first underfill has physical properties exhibiting stronger resistance against external impacts than the second underfill, crack occurrence may be reduced, e.g., as compared to a case where only the second underfill is used.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A package structure, comprising:
a lower substrate;
substrate connection terminals on the lower substrate;
a semiconductor package on the substrate connection terminals, the semiconductor package including a package substrate and an encapsulant covering the package substrate; and
a first underfill and a second underfill between the lower substrate and the semiconductor package, the first underfill including:
an inner portion overlapping the semiconductor package in a vertical direction, the inner portion covering at least one of the substrate connection terminals, and
an outer portion not overlapping the semiconductor package in the vertical direction.

2. The package structure as claimed in claim 1, wherein:
the inner portion contacts at least a portion of a bottom of the semiconductor package, and
the outer portion contacts at least a portion of a side surface of the semiconductor package.

3. The package structure as claimed in claim 1, wherein the second underfill contacts the inner portion of the first underfill.

4. The package structure as claimed in claim 1, wherein a height of a portion of the semiconductor package covered by the outer portion is 80% or less of a height of the semiconductor package.

5. The package structure as claimed in claim 1, wherein an upper end of the outer portion is at a higher level than an upper end of the inner portion.

6. The package structure as claimed in claim 1, wherein a total area of the inner portion is 40% or less of an area of a bottom of the package substrate.

7. The package structure as claimed in claim 1, wherein cross-sections of the inner portion and the outer portion are concave.

8. The package structure as claimed in claim 1, wherein cross-sections of the inner portion and the outer portion are convex.

9. The package structure as claimed in claim 1, wherein a lower surface of the first underfill and a lower surface of the second underfill are coplanar.

10. The package structure as claimed in claim 1, wherein:
a coefficient of thermal expansion (CTE) of the first underfill is greater than a CTE of the second underfill by 50% or more,
a modulus of the first underfill is 50% or less than a modulus of the second underfill,
a filler content of the first underfill is lower than a filler content of the second underfill, and
an elongation of the first underfill is greater than an elongation of the second underfill by 50% or more.

11. The package structure as claimed in claim 10, wherein:
the CTE of the first underfill is 50 ppm/° C. to 500 ppm/° C.,
the modulus of the first underfill is 1 GPa or less,
the filler content of the first underfill is 40 wt % or less, and
the elongation of the first underfill is 10% or more.

12. The package structure as claimed in claim 11, wherein:
the CTE of the second underfill is 10 ppm/° C. to 40 ppm/° C.,
the modulus of the second underfill is 5 GPa or more,
the filler content of the second underfill is 45 wt % to 60 wt %, and
the elongation of the second underfill is 5% or less.

13. The package structure as claimed in claim 1, wherein, in a plan view, a length of a portion of a side surface of the semiconductor package covered by the first underfill is less than ⅓ of a length of the side surface of the semiconductor package.

14. The package structure as claimed in claim 1, wherein:
the outer portion of the first underfill includes a first extension portion extending in a first horizontal direction and a second extension portion extending in a second horizontal direction intersecting the first horizontal direction, and
the first extension portion and the second extension portion partially cover a side surface of the semiconductor package, as viewed in a plan view.

15. The package structure as claimed in claim 1, further comprising a third underfill between the lower substrate and the semiconductor package, the third underfill partially covering a side surface of the semiconductor package, as viewed in a plan view.

16. A package structure, comprising:
a lower substrate;
substrate connection terminals on the lower substrate;
a semiconductor package on the substrate connection terminals, the semiconductor package including a package substrate and an encapsulant covering the package substrate; and
a first underfill and a second underfill between the lower substrate and the semiconductor package, the first underfill including:
an inner portion overlapping the semiconductor package in a vertical direction, the inner portion covering at least one of the substrate connection terminals, and
an outer portion not overlapping the semiconductor package in the vertical direction, the outer portion covering side surfaces of the package substrate and the encapsulant.

17. A package structure, comprising:
a lower substrate;
substrate connection terminals on the lower substrate;
a semiconductor package on the substrate connection terminals, the semiconductor package including a package substrate and an encapsulant covering the package substrate; and
a first underfill and a second underfill between the lower substrate and the semiconductor package,
wherein the first underfill includes:
a first inner portion overlapping the semiconductor package in a vertical direction, the first inner portion covering at least one of the substrate connection terminals, and
a first outer portion not overlapping the semiconductor package in the vertical direction, the first outer portion covering at least a portion of a side surface of the semiconductor package, and
wherein the second underfill includes:
a second inner portion overlapping the semiconductor package in the vertical direction, the second inner portion covering a greater number of the substrate connection terminals than a number of the substrate connection terminals covered by the first inner portion, and a second outer portion not overlapping the semiconductor package in the vertical direction.

18. The package structure as claimed in claim 17, wherein an upper end of the first outer portion is at a higher level than an upper end of the second outer portion.

19. The package structure as claimed in claim 18, wherein the first outer portion contacts at least the portion of the side surface of the semiconductor package.

20. The package structure as claimed in claim 17, wherein the first outer portion extends longer than the second outer portion in a horizontal direction perpendicular to the side surface of the semiconductor package.

* * * * *